(12) United States Patent
Heinrich et al.

(10) Patent No.: US 11,757,442 B2
(45) Date of Patent: Sep. 12, 2023

(54) METHOD AND SWITCHING CIRCUIT FOR CONNECTING AND DISCONNECTING CURRENT TO A LOAD HAVING INDUCTANCE

(71) Applicant: Aptiv Technologies Limited, St. Michael (BB)

(72) Inventors: Markus Heinrich, Dublin (IE); Emmanuel Boudoux, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 17/390,003

(22) Filed: Jul. 30, 2021

(65) Prior Publication Data
US 2022/0038089 A1 Feb. 3, 2022

(30) Foreign Application Priority Data
Jul. 31, 2020 (GB) ..................................... 2011977

(51) Int. Cl.
*H03K 17/0812* (2006.01)
*H02H 3/093* (2006.01)

(52) U.S. Cl.
CPC ....... *H03K 17/08122* (2013.01); *H02H 3/093* (2013.01); *H03K 2217/0036* (2013.01)

(58) Field of Classification Search
CPC .............. H03K 17/08; H03K 17/081; H03K 17/08104; H03K 17/08112;
(Continued)

(56) References Cited

U.S. PATENT DOCUMENTS

| 4,611,135 A | 9/1986 | Nakayama et al. |
| 4,893,158 A | 1/1990 | Mihara et al. |

(Continued)

FOREIGN PATENT DOCUMENTS

| CN | 208834990 | 5/2019 |
| DE | 2638178 | 3/1978 |

(Continued)

OTHER PUBLICATIONS

"Search Report", GB Application No. 2011977.2, dated Dec. 16, 2020, 4 pages.
(Continued)

*Primary Examiner* — Thienvu V Tran
*Assistant Examiner* — Carlos O Rivera-Perez
(74) *Attorney, Agent, or Firm* — Sawtooth Patent Group PLLC (57) ABSTRACT

A switching circuit has a primary MOSFET switch connected between first and second terminals that are connected to a power line and a load represented as a resistance and inductance. The primary switch is operable by primary control commands to assume a conductive or non-conductive state. Four protection branches are connected in parallel with the primary switch, each having a series connected resistive element and a secondary MOSFET switch operable by branch control commands received at branch command terminals to assume a conductive or non-conductive state. A timing circuit applies branch turn off control commands in sequence to the branch command terminals, each delayed by a different predetermined time interval relative to when a primary turn off control command is applied to the primary switch.

20 Claims, 8 Drawing Sheets

(58) Field of Classification Search
CPC ......... H03K 17/08116; H03K 17/0812; H03K 17/08122; H03K 17/08126; H03K 17/08128; H03K 17/0814; H03K 17/08142; H03K 17/08146; H03K 17/08148; H03K 17/082; H03K 17/0822; H03K 17/0826; H03K 17/0828; H03K 17/12; H03K 17/122; H03K 17/127; H03K 17/16; H03K 17/161; H03K 17/162; H03K 17/163; H03K 17/164; H03K 17/296; H03K 17/51; H03K 17/56; H03K 17/567; H03K 17/687; H03K 2217/0036; H02H 3/02; H02H 3/021; H02H 3/023; H02H 3/025; H02H 3/027; H02H 3/033; H02H 3/08; H02H 3/093; H02H 3/0935; H02M 1/08; H02M 1/12; H02M 1/123; H02M 1/126; H02M 1/14; H02M 1/143; H02M 1/15; H02M 1/32; H02M 1/34–348
USPC ....... 361/2–14, 58, 91.7, 93.1–102; 323/205, 323/208, 222–226, 271–278, 293, 297, 323/298, 908
See application file for complete search history.

(56) References Cited

U.S. PATENT DOCUMENTS

| | | |
|---|---|---|
| 5,187,632 A | 2/1993 | Blessing |
| 5,283,707 A | 2/1994 | Conners et al. |
| 6,075,684 A * | 6/2000 | Duba ............... H03K 17/08142 361/4 |
| 7,760,479 B2 | 7/2010 | Garrett |
| 2009/0218890 A1 | 9/2009 | Lui et al. |
| 2019/0199082 A1 | 6/2019 | Boesche et al. |

FOREIGN PATENT DOCUMENTS

| | | |
|---|---|---|
| DE | 3500039 | 1/1986 |
| DE | 4237119 | 2/1994 |
| EP | 0945983 | 9/1999 |
| GB | 2550661 | 11/2017 |
| WO | 02082611 | 10/2002 |
| WO | 2010038107 | 4/2010 |

OTHER PUBLICATIONS

"Extended European Search Report", EP Application No. 21188595.9, dated Dec. 14, 2021, 10 pages.

* cited by examiner

METHOD AND SWITCHING CIRCUIT FOR CONNECTING AND DISCONNECTING CURRENT TO A LOAD HAVING INDUCTANCE

CROSS-REFERENCE TO RELATED APPLICATION

This application claims priority to UK Patent Application Number 2011977.2, filed Jul. 31, 2020, the disclosure of which is hereby incorporated by reference in its entirety herein.

BACKGROUND

When a power line is providing current to a load, if a short circuit occurs in the load, the current flowing to the load must be disconnected quickly to avoid a dangerously high flow of current. Typically, a solid state switch such as a MOSFET or IGBT is used to connect and disconnect the power line to the load due to their fast switching time. They can be provided in circuit either singly or as a plurality connected in parallel.

Many loads have inductance (L) associated with them. Although the amount of inductance is typically quite small, when the current (I) being provided is high, there can be significant amounts of energy (E) associated with the inductance at the time of disconnection ($E=\frac{1}{2} \cdot L \cdot i^2$). For example, with high currents, the amount of energy can be as much as 1 Joule and can reach 10 Joules for even higher currents. This energy must be dissipated without damage to any components.

As is known in the art, MOSFETS are designed with a breakdown voltage $V_{BR}$ which, if exceeded, means the MOSFET is being used outside its datasheet specification and can lead to the phenomena known as avalanche. If the energy associated with a single pulse avalanche is high, this can lead to a current or temperature build up in the MOSFET that can cause failure of the MOSFET either through slow build damage or immediate destruction.

Figure 1:
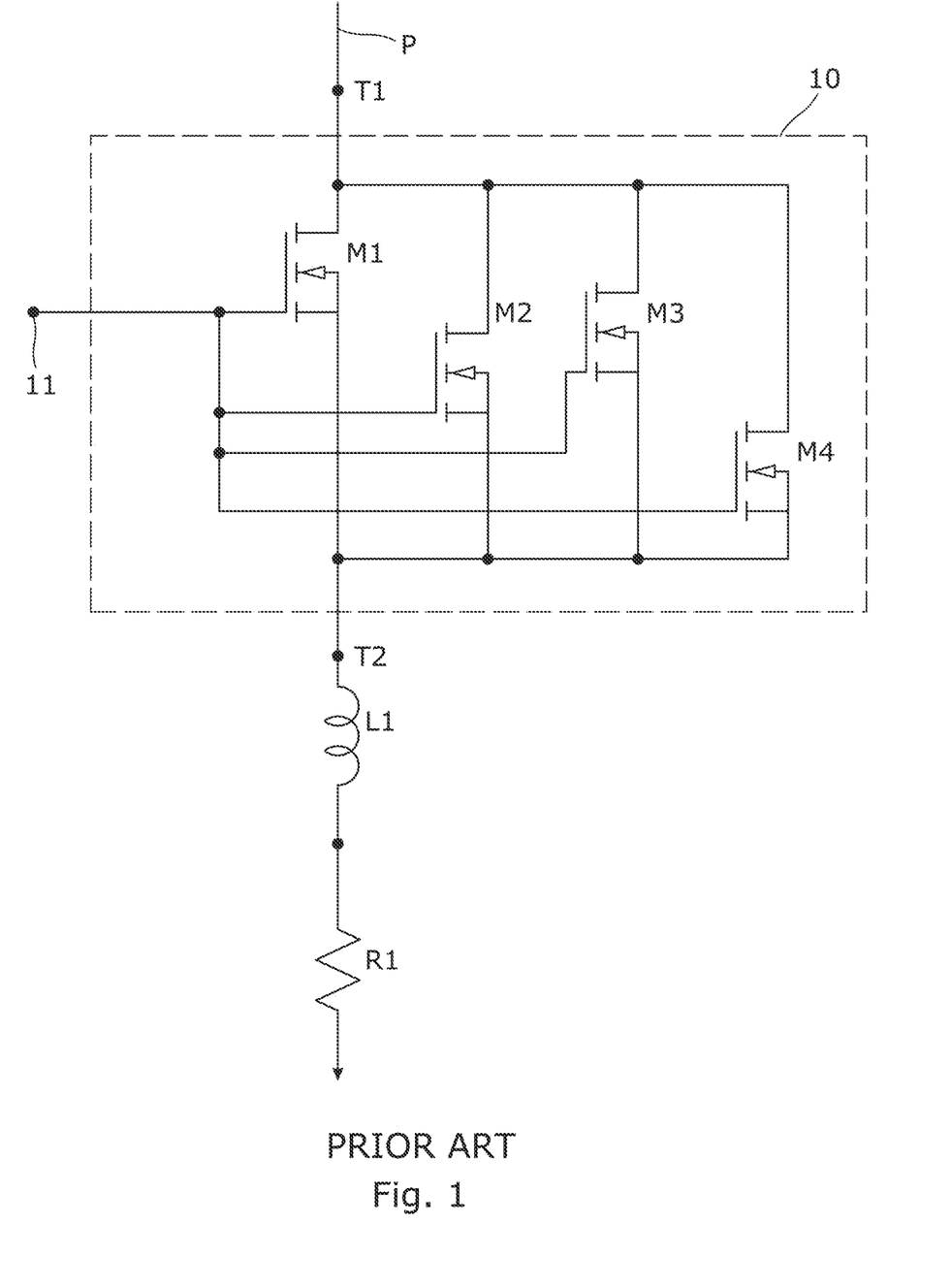
FIG. 1 shows a known switching circuit.

FIG. 1 shows a known example of a switching circuit for connecting and disconnecting current to a load having inductance. The switching circuit has terminals T1 and T2. The terminal T1 is connected to a power line P connected to a source of power, for example a car battery having a supply voltage V. The terminal T2 is connected to a load which has inductance, for example a harness in the car field. The load is represented by a series connected load resistor R1 connected to earth, and an associated inductance represented as a coil L1 having inductance $L_c$.

A solid state or discrete solution switch arrangement 10 is connected between terminals T1 and T2 and includes four MOSFETs M1 to M4 connected in parallel with their drains connected to terminal T1. The solid state or discrete solution switch arrangement 10 has a command terminal 11 for receiving turn on and turn off control commands which operate the MOSFETs M1 to M4 to assume a conductive or non-conductive state respectively. It will be appreciated that a turn on control command comprises a voltage applied to command terminal 11, so that the MOSFETs M1 to M4 assume a conductive state, and a turn off control command comprises not applying a voltage to the command terminal 11 so that the MOSFETs M1 to M4 assume a non-conductive state.

The resistance of the MOSFETs and the coil L1 are considered to be negligible under normal working conditions. It will be appreciated that in some examples, the solid state or discrete solution switch arrangement will only include a single MOSFET. The solid state or discrete solution switch arrangement 10 is the primary way to connect and disconnect current to the load.

If a short circuit occurs in the load, it can be represented as a new resistor $R1_{short}$ having such a low resistive value that the resistance of the MOSFETS is no longer negligible in comparison. A sensor is used to detect the short circuit, the details of which can take many different forms known to those skilled in the art. At the time of sensing a short circuit, a turn off control command is applied to the terminal 11 which causes each of the MOSFETs M1-M4 to simultaneously assume a non-conductive state. As noted above, a MOSFET or IGBT solid state switch has a fast switching time so that the circuit arrangement in FIG. 1 will act faster than a fuse.

However, when the short circuit occurs, there is a time delay before the MOSFETs M1-M4 actually assume a non-conductive state to disconnect the current flow. Consequently, the current I in the coil L1 rises quickly and an increasing negative voltage will also develop across the coil L1 ($V=L_c \cdot di/dt$). Furthermore, the stored energy in the coil L1 rises even more quickly than the current which can reach a very high value which must discharge through an available path.

Two problems are associated with such a short circuit in the case that high currents are being provided and disconnected. Firstly, the negative voltage across the coil L1 results in an increase in the voltage across the MOSFETs M1-M4. As the MOSFETs M1-M4 are not entirely equal due to device to device variation, the current will flow preferentially through one MOSFET and the voltage across it may then exceed the breakdown voltage, leading to avalanche, and this MOSFET may then fail. Secondly, the MOSFETs M1-M4 are unable to withstand the energy that has to be dissipated from the coil L1 and the MOSFETs may fail. Even if failure does not occur with a first short circuit, damage is likely to build up so that failure may happen with the next short circuit. In either case, there is the potential for a soft short circuit and the MOSFET may not be able to correctly open leading to safety concerns.

Currently, a single MOSFET is not able to withstand the above mentioned disconnection when higher currents are being provided, and even parallel connected MOSFETs are not able to be used for the reasons mentioned above. There is therefore a need for a switching circuit that does not have such problems.

SUMMARY

The present disclosure concerns systems, methods, and switching circuits to protect solid state or discrete solution switches which are being used for connecting and disconnecting a power line providing relatively higher current to a load having inductance. In addition, the present disclosure concerns means for protecting such solid state or discrete solution switches, in accordance with the described techniques.

According to a first aspect, there is provided a method for disconnecting a power line providing current to a load having inductance. The method includes connecting a primary solid state or discrete solution switch arrangement between the power line and the load, the primary solid state or discrete solution switch arrangement operable by primary turn on or turn off control commands to assume a conductive or non-conductive state, and connecting, in parallel with the primary solid state or discrete solution switch arrangement, one or more protection branches each comprising a series connected resistive element and a secondary solid state or discrete solution switch which is operable by branch turn on or turn off control commands to assume a conductive or non-conductive state. The method further includes applying a primary turn off control command to the primary solid state or discrete solution switch arrangement, and applying, to the secondary solid state or discrete solution switch of the or each protection branch, a branch turn off control command which is delayed by a predetermined time interval relative to the primary turn off control command.

In one embodiment, wherein a plurality of protection branches are provided, the method further comprises applying the branch turn off control command to the secondary solid state or discrete solution switch of each protection branch sequentially.

In another embodiment, the method further comprises applying branch turn off control commands in sequence to the secondary solid state or discrete solution switches of the protection branches, each delayed by a different predetermined time interval relative to when a primary turn off control command is applied to the primary solid state or discrete solution switch arrangement.

According to a second aspect, there is provided a switching circuit for disconnecting a power line providing current to a load having inductance, the circuit including a first terminal for connection to the power line, a second terminal for connection to the load, and a primary solid state or discrete solution switch arrangement connected between the first terminal and the second terminal and operable by primary turn on or turn off control commands to assume a conductive or non-conductive state. The circuit further includes one or more protection branches connected in parallel with the primary solid state or discrete solution switch arrangement, the one or more protection branches each comprising a series connected resistive element and a secondary solid state or discrete solution switch which is operable by branch turn on or turn off control commands to assume a conductive or non-conductive state, and a timing circuit configured to apply, to the secondary solid state or discrete solution switch of the or each protection branch, a branch turn off control command which is delayed by a predetermined time interval relative to when a primary turn off control command is applied to the primary solid state or discrete solution switch arrangement.

In one embodiment, the switching circuit comprises a single branch.

In one case, the timing circuit is configured to apply a branch turn off control command which switches the secondary solid state or discrete solution switch of the protection branch at a speed whereby a non-negligible amount of the energy from the inductance is dissipated therein.

In another case, the timing circuit is configured to apply a branch turn off control command which switches the secondary solid state or discrete solution switch of the protection branch at a speed whereby a negligible amount the energy from the inductance is dissipated therein.

In another embodiment, the switching circuit comprises a plurality of protection branches.

In one embodiment, the timing circuit is configured to apply branch turn off control commands in sequence to the secondary solid state or discrete solution switches of the protection branches, each delayed by a different predetermined time interval relative to when a primary turn off control command is applied to the primary solid state or discrete solution switch arrangement.

In one embodiment, the timing circuit is configured to apply a branch turn off control command to at least one protection branch which switches the secondary solid state or discrete solution switch of that protection branch at a speed whereby a non-negligible amount of the energy from the inductance is dissipated therein.

In one case, the timing circuit is configured to apply a branch turn off control command to all protection branches which switches the secondary solid state or discrete solution switches at a speed whereby a non-negligible amount of the energy from the inductance is dissipated therein.

In one embodiment, the timing circuit is configured to apply a branch turn off control command to at least one protection branch which switches the secondary solid state or discrete solution switch of that protection branch at a speed whereby a negligible amount of the energy from the inductance (L1) is dissipated therein.

In one case, the timing circuit is configured to apply a branch turn off control command to all protection branches which switches the secondary solid state or discrete solution switches at a speed whereby a negligible amount of the energy from the inductance is dissipated therein.

In another embodiment, the primary solid state or discrete solution switch arrangement comprises a plurality of solid state or discrete solution switches connected in parallel between the first terminal and the second terminal and operable by a common turn on or turn off control command.

In another embodiment, the solid state or discrete solution switches comprise MOSFET switches or IGBT switches.

In one embodiment, the control command to turn off is the absence of a control command to turn on.

In another embodiment, the timing circuit is connected to receive the same control commands as the first solid state or discrete solution switch arrangement.

In one embodiment, the timing circuit comprises at least one of an RC circuit having a predetermined time constant, a counter, or a microprocessor.

In another embodiment, the resistance of the resistive element and the predetermined time interval of the timing circuit are selected to absorb a sufficient amount of the energy in the inductive component to protect the primary solid state or discrete solution switch arrangement after a main turn off control command is applied thereto.

BRIEF DESCRIPTION OF DRAWINGS

Illustrative embodiments will now be described with reference to the accompanying drawings in which are summarized as follows.

DETAILED DESCRIPTION

The present disclosure relates to a method and switching circuit for connecting and disconnecting a power line providing current to a load having inductance. In particular, when a solid state switch is used, for enabling the connection and disconnection.

Figure 2:
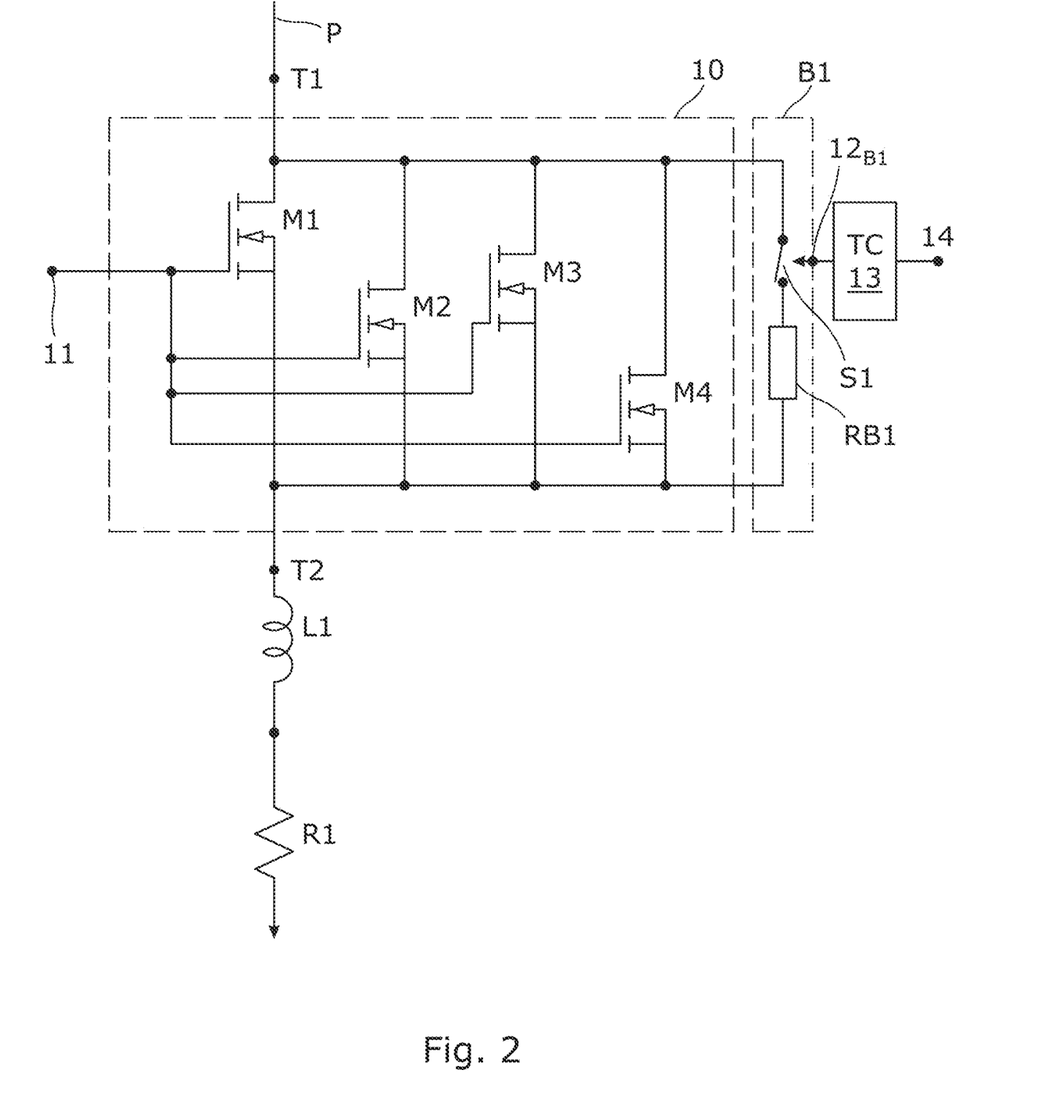
FIG. 2 shows a first embodiment of a switching circuit including a single protection branch circuit.

FIG. 2 shows a first embodiment of a switching circuit illustrating how to reduce the effect of the increasing voltage resulting from inductance associated with a load and how to accommodate the dissipation of energy associated with that inductance. Components in FIG. 2 which are common to FIG. 1 bear the same reference numbers and will not be described again.

As can be seen from FIG. 2, a protection branch B1 is connected in parallel with the primary solid state switch arrangement 10, in effect being connected to terminals T1 and T2. The protection branch B1 comprises a secondary solid state switch, in this case MOSFET S1, connected in series with a ballast resistive element RB1. The MOSFET S1 has a branch command terminal $12_{B1}$, its gate, connected to a timing circuit 13. The timing circuit 13 has an input terminal 14 and is initiated to produce an output by receiving the turn on and turn off control commands received at command terminal 11. The output provides branch turn on and turn off control commands to the branch command terminal $12_{B1}$. As can seen, the timing circuit 13 has the input terminal 14 receiving the control commands received at the command terminal 11. It will be appreciated that the present disclosure is not limited in this way and a timing circuit can be provided which is initiated by other signals provided in a coordinated way with the control commands at the command terminal 11.

In operation, to turn on the switching circuit shown in FIG. 2, a turn on control command is applied to command terminal 11, which is also applied to the input terminal 14 of the timing circuit 13. As a consequence, the control command at command terminal 11 makes MOSFETs M1-M4 assume a conductive state. In addition, the timing circuit 13, initiated in response to the control command at input terminal 14, outputs a branch turn on control command to the branch command terminal $12_{B1}$ so that the MOSFET S1 assumes a conductive state. It will be appreciated that the timing circuit 13 can be designed so that a branch turn on control command is output to the branch command terminal $12_{B1}$ at the same time as the turn on control command is received at the input terminal 14. The present disclosure is not limited in this way however and there can be a delay.

When a short circuit occurs in the load, effectively short circuiting the resistor R1 at time to, a turn off control command is applied to the command terminal 11 which causes each of the MOSFETs M1-M4 to simultaneously assume a non-conductive state. The same command appears at input terminal 14. In this case, the timing circuit 13 introduces a predetermined time delay before the output of a branch turn off control command is output to branch command terminal $12_{B1}$. Consequently, just after time to when MOSFETs M1-M4 have assumed a non-conductive state, the current will now flow through the ballast resistive element RB1 because the branch turn off control command has not yet been applied to the branch command terminal $12_{B1}$ from the output of the timing circuit 13.

A timing circuit to provide the predetermined time interval relative to the turn off control command to MOSFETs M1-M4 can be, for example, a simple RC low path. The low path can be implemented with resistors between the MOSFETs M1-M4 branch turn off control command and the branch turn off control command and capacitors connected between the branch turn off control command and terminal T2.

The value of the resistance of the ballast resistive element RB 1 is determined depending on the amount of energy that has to be dissipated from the coil L1 and in order to ensure that the negative voltage increase across the coil L1 does not lead to a voltage across the MOSFETs M1-M4 of the primary solid state switch arrangement which could lead to their failure.

Figure 3:
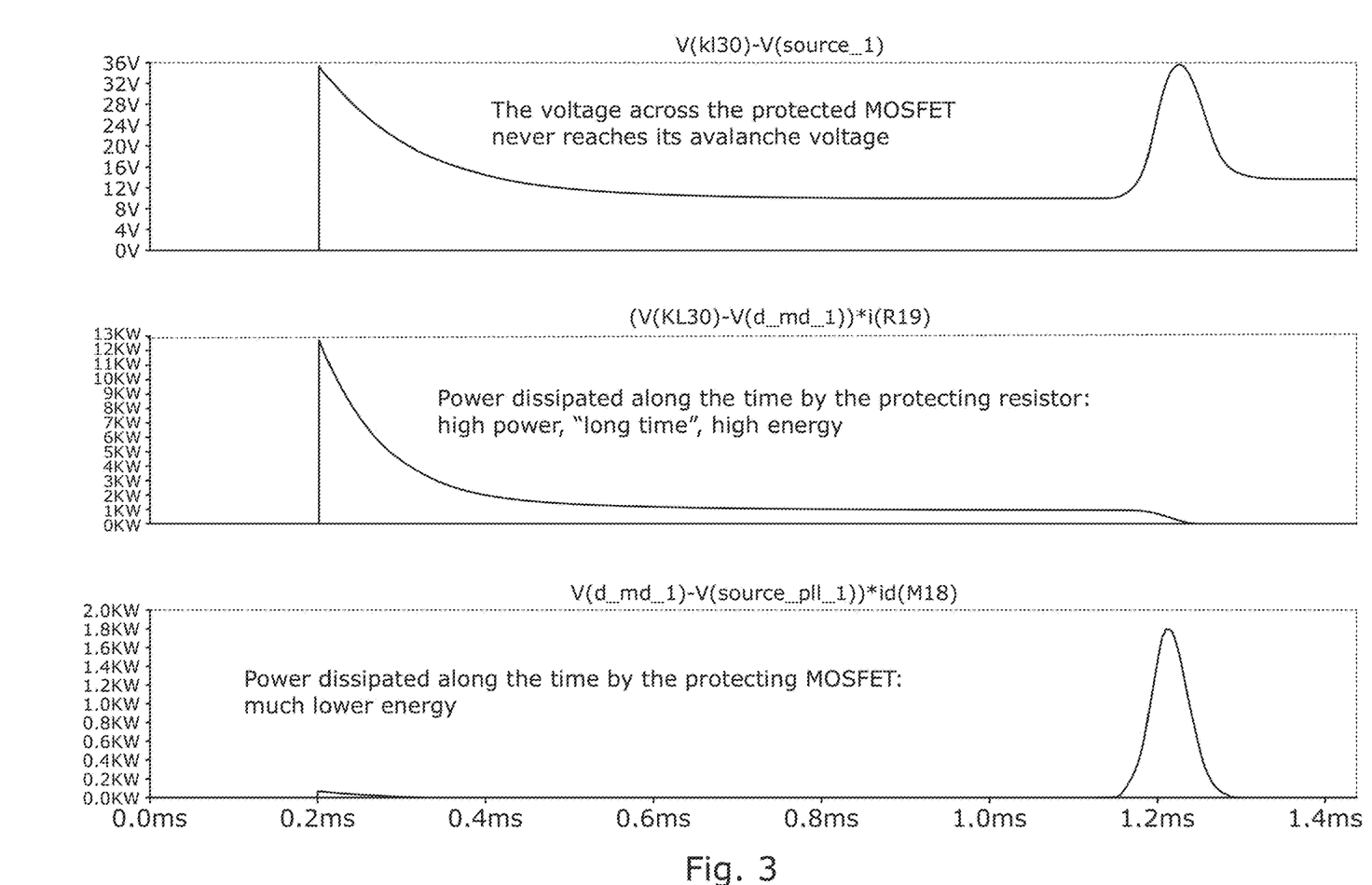
FIG. 3 shows illustrates example graphs of voltage and power against time for components in FIG. 2.

FIG. 3 illustrates various waveforms for the components in the circuit of FIG. 2 from when the turn off control command is applied to the command terminal 11 to actually turn off the MOSFETs M1 to M4 at about 0.2 ms until expiry of the predetermined time delay at which point the turn off control command is applied to the command terminal $12_{B1}$ to actually turn off the MOSFET S1 at about 1.2 ms.

The upper graph shows the voltage across the solid state switch arrangement 10, and in particular the voltage across MOSFETS M1-M4. As can be seen, the voltage initially goes up when MOSFETs M1-M4 are turned off but due to the protection branch B1, it gradually declines until a small pulse occurs at the time the MOSFET S1 is turned off. It can be seen that the voltage across the MOSFETs M1-M4 is limited and never reaches the breakdown and avalanche voltage.

The middle graph illustrates the power dissipated over time in the ballast resistive element RB1. It can be seen that the energy in the ballast resistive element RB1 increases rapidly at the time of the short circuit when MOSFETs M1-M4 are turned off but diminishes over time until the MOSFET S1 is turned off. It can be seen that considerable energy can therefore be dissipated during this time.

The lower graph illustrates the power that is dissipated in the MOSFET S1. It can be seen that the power dissipated in the MOSFET S1 is negligible from the time when MOSFETs M1-M4 are turned off until a small pulse of power occurs at the time when the MOSFET S1 is turned off. Even then, the amount of power is relatively low compared with the power that has been dissipated in the ballast resistive element RB1 and can be accommodated by the specification for the MOSFET S1.

Consequently, the energy from the coil L1 is dissipated by the ballast resistive element RB1 and the voltage developed across the coil L1 is limited so that the aforementioned breakdown voltage is not reached. Thus, by including the protection branch in FIG. 2, the primary solid state switch arrangement 10 is protected from failure by dissipating the energy from the coil L1 and by limiting the voltage across the solid state switch arrangement to that it does not exceed the breakdown voltage.

It will be appreciated that FIG. 2 illustrates high side switching with the MOSFET S1 being connected to terminal T1. The positions of the MOSFET S1 and the resistive element RB1 can be reversed to provide low side switching with the MOSFET S1 connected to terminal T2.

Figure 4:
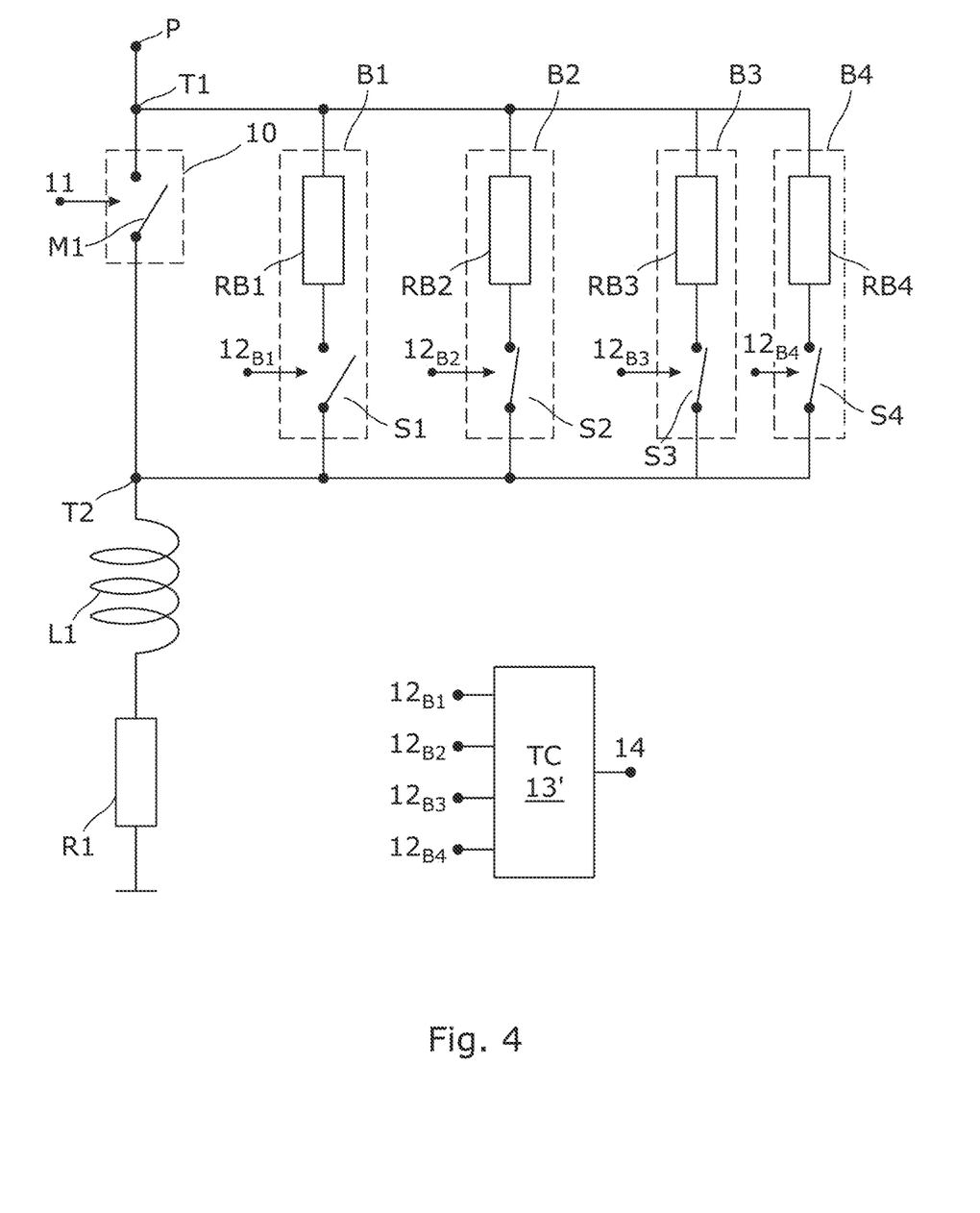
FIG. 4 shows a second embodiment of a switching circuit including multiple protection branch circuits.

FIG. 4 shows a second embodiment of a switching circuit which enables improved reduction of the effect of increasing voltage resulting from inductance associated with the load and an improved accommodation of the dissipation of energy associated with that inductance. Components in FIG. 4 which are common to FIG. 2 bear the same reference numbers and will not be described again.

As can be seen, FIG. 4 includes a primary solid state switch arrangement 10 in the form of a single MOSFET M1. In this embodiment, four protection branches B1, B2, B3 and B4 are used instead of the single protection branch B1 of FIG. 2.

Protection branch B1 comprises a ballast resistive element RB1, connected to terminal T1, in parallel with a secondary solid state switch, in this case MOSFET S1, connected to terminal T2. The MOSFET S1 has a branch command terminal $12_{B1}$ connected to a timing circuit 13'.

Protection branch B2 comprises a ballast resistive element RB2, connected to terminal T1, in parallel with a secondary solid state switch, in this case MOSFET S2, connected to terminal T2. The MOSFET S2 has a branch command terminal $12_{B2}$ connected to a timing circuit 13'.

Protection branch B3 comprises a ballast resistive element RB3, connected to terminal T1, in parallel with a secondary solid state switch, in this case MOSFET S3, connected to terminal T2. The MOSFET S3 has a branch command terminal $12_{B3}$ connected to a timing circuit 13'.

Protection branch B4 comprises a ballast resistive element RB4, connected to terminal T1, in parallel with a secondary solid state switch, in this case MOSFET S4, connected to terminal T2. The MOSFET S4 has a branch command terminal $12_{B4}$ connected to a timing circuit 13'.

It will be appreciated that FIG. 4 illustrates low side switching.

Timing circuit 13' has an input terminal 14 to receive the turn on and turn off control commands received at command terminal 11. However, in this case, the timing circuit 13' has outputs which provide respective branch turn on and turn off control commands to the four branch command terminals $12_{B1}$, $12_{B2}$, $12_{B3}$, $12_{B4}$.

As with FIG. 2, the timing circuit 13' can be designed so that a branch turn on control command is output to the branch command terminals $12_{B1}$, $12_{B2}$, $12_{B3}$, $12_{B4}$ at the same time as the turn on control command is received at the input terminal 14. As with FIG. 2, at the time of a turn off control command at command terminal 11, the timing circuit 13' introduces a predetermined time delay before the output of branch turn off control commands to branch command terminals $12_{B1}$, $12_{B2}$, $12_{B3}$, $12_{B4}$. However, in this case, timing circuit 13' is further designed to provide the branch turn off control commands in a sequence with a predetermined time interval $\Delta_1$, $\Delta_2$, $\Delta_3$, $\Delta_4$, between each of them, that is to say a branch turn off control command is output firstly to branch command terminal $12_{B1}$, then secondly to branch command terminal $12_{B2}$, then thirdly to branch command terminal $12_{B3}$, and finally to branch command terminal $12_{B4}$. Alternatively, the time intervals can be considered as a time delay relative to a time origin occurring at the time the turn off control command is applied to control terminal 11.

FIG. 5 shows various waveforms for the components in the circuit of FIG. 4 when the turn off control command is applied to the command terminal 11 to actually turn off the MOSFET M1 at about 1 ms.

Figure 5A:
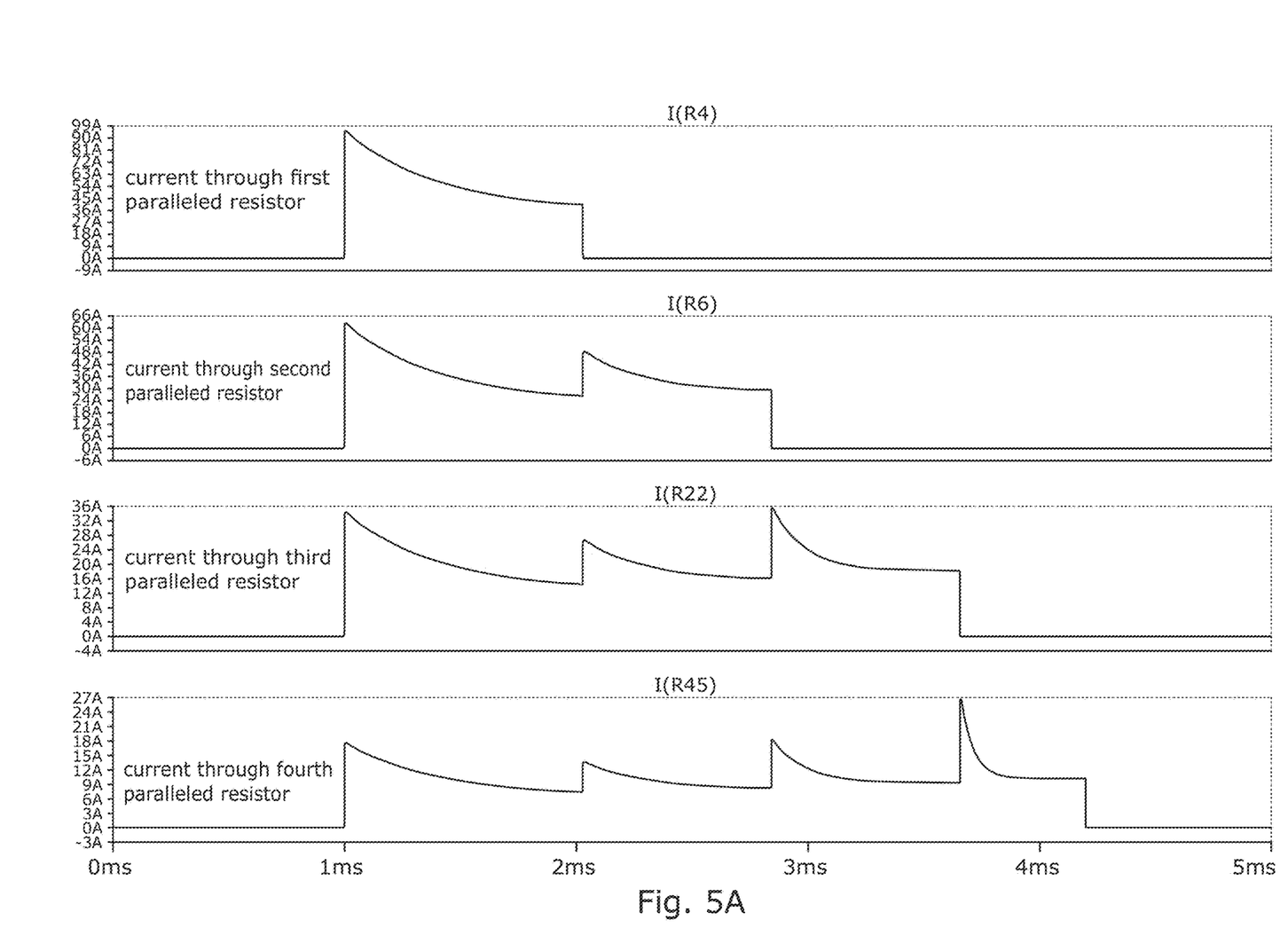
FIG. 5A shows an example graph of current against time for the ballast resistive elements used in FIG. 4.

In FIG. 5A, the upper graph shows the current flowing in the first parallel ballast resistive element RB1. As can be seen, the current initially rises but diminishes as energy is dissipated and drops to zero at about 2 ms (after time interval $\Delta_1$) when a turn off control command is applied to control terminal $12_{B1}$.

The graph below shows the current flowing in the second parallel ballast resistive element RB2, which starts at a lower level compared with ballast resistive element RB1, which initially rises up but diminishes as energy is dissipated. When a turn off control command is applied to control terminal $12_{B1}$, the current rises again but not so much and diminishes as energy is dissipated and drops to zero at about 2.8 ms (after time interval $\Delta_2$) when a turn off control command is applied to control terminal $12_{B2}$.

The graph below shows the current flowing in the third parallel ballast resistive element RB3, which starts at a lower level compared with ballast resistive element RB2, which initially rises but diminishes as energy is dissipated. When a turn off control command is applied to control terminal $12_{B1}$, the current rises again but not so much and diminishes as energy is dissipated. When a turn off control command is applied to control terminal $12_{B2}$, the current rises yet again and diminishes as energy is dissipated and drops to zero at about 3.6 ms (after time interval $\Delta_3$) when a turn off control command is applied to control terminal $12_{B3}$.

The lower graph shows the current flowing in the fourth parallel ballast resistive element RB4, which starts at a lower level compared with ballast resistive element RB3, which initially rises but diminishes as energy is dissipated. When a turn off control command is applied to control terminal $12_{B1}$, the current rises again but not so much and diminishes as energy is dissipated. When a turn off control command is applied to control terminal $12_{B2}$, the current rises yet again and diminishes as energy is dissipated. When a turn off control command is applied to control terminal $12_{B3}$, the current rises yet again and diminishes as energy is dissipated and drops to zero at about 4.2 ms (after time interval $\Delta_4$) when a turn off control command is applied to control terminal $12_{B4}$.

Figure 5B:
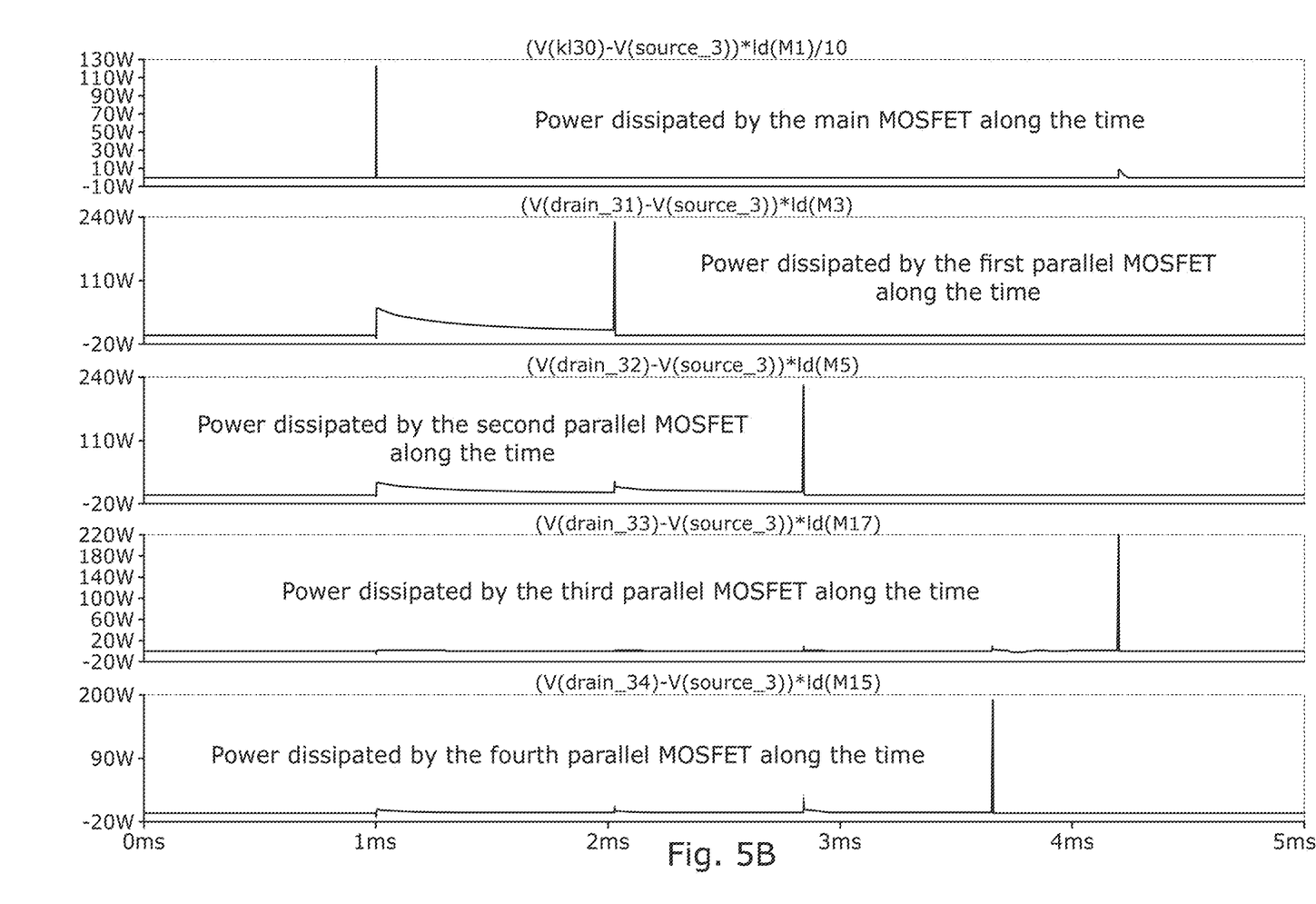
FIG. 5B shows an example graph of power dissipated against time for the MOSFETs used in FIG. 4.
Figure 5C:
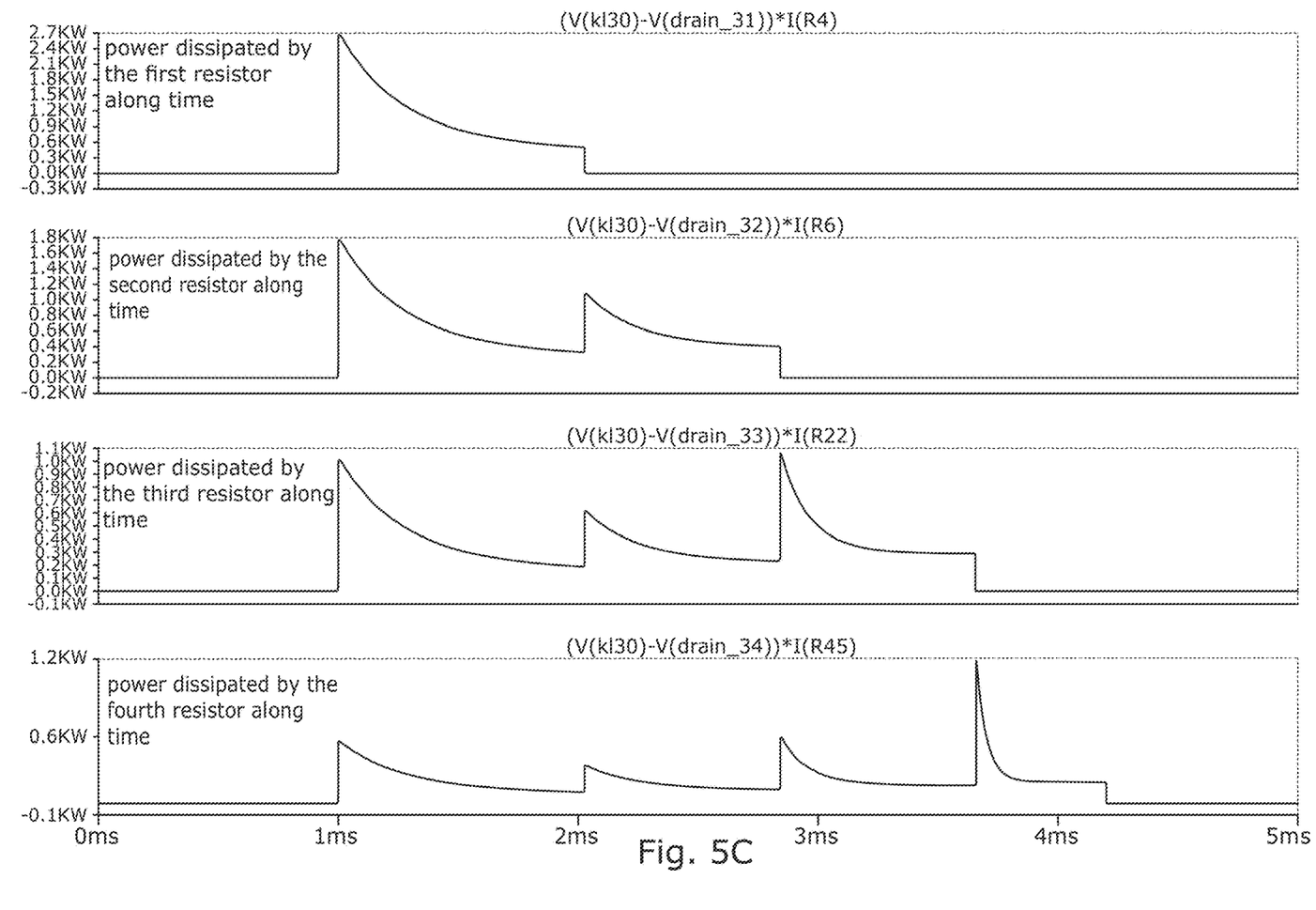
FIG. 5C shows an example graph of power dissipated against time for the ballast resistive elements used in FIG. 4.

FIG. 5C shows the amount of power dissipated by the ballast resistive elements RB1-RB4 in the same order as FIG. 5A. As can be seen, the major amount of power is dissipated in ballast resistive element RB1 with lesser amounts dissipated in each of the ballast resistive elements RB2-RB4 as shown.

FIG. 5B shows the amount of power dissipated in the various MOSFETs. In particular, the upper graph illustrates the amount of power dissipated in the MOSFET M1 of the solid state switch arrangement 10 with the lower graphs showing, in order, the amount dissipated in each of the MOSFETs S1-S4 of the branches B1 to B4 (labelled first to fourth parallel MOSFETs in the figure).

Figure 5D:
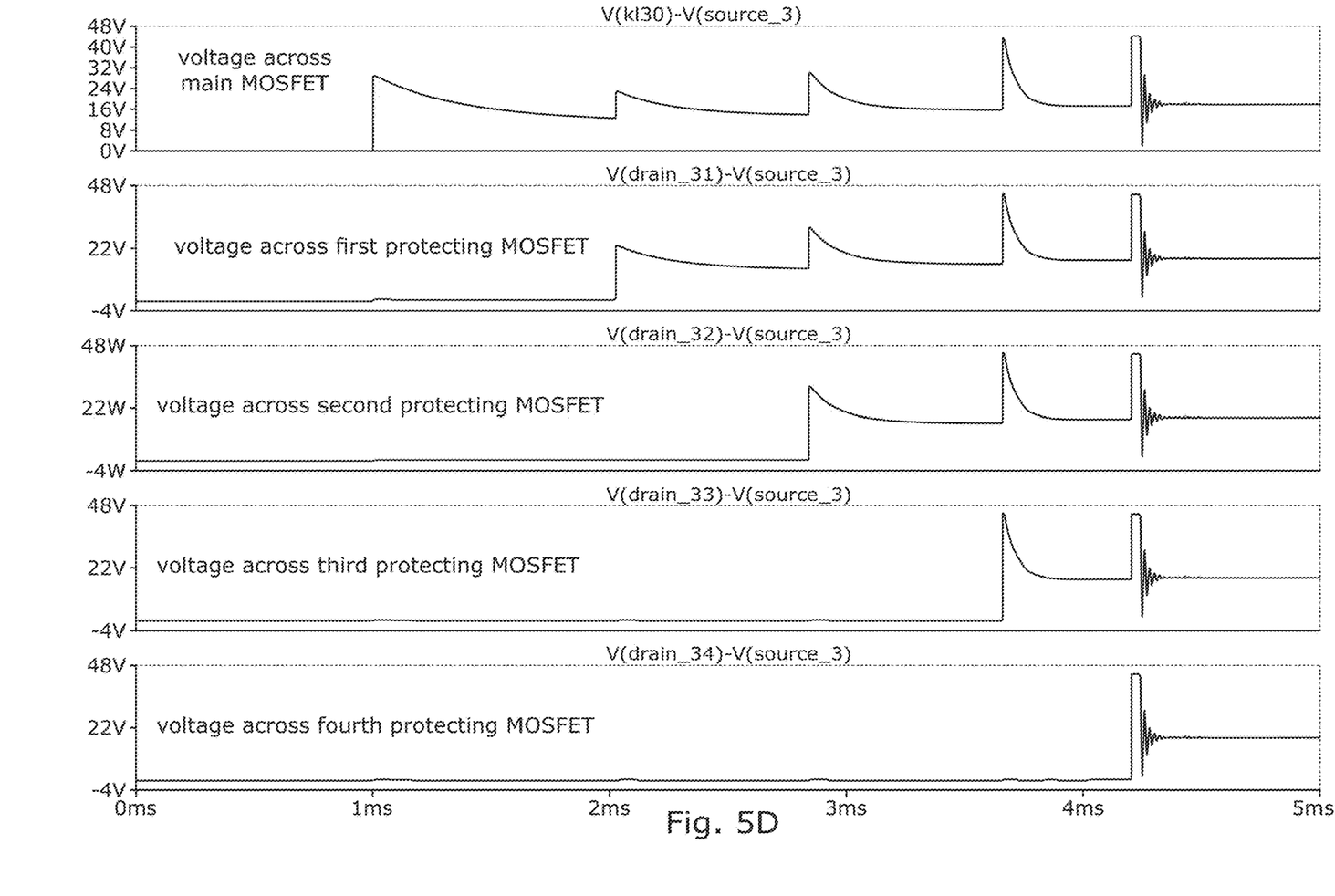
FIG. 5D shows an example graph of voltage against time across the MOSFETs used in FIG. 4.

FIG. 5D shows the voltage across the various MOSFETs. In particular, the upper graph illustrates the voltage across the main MOSFET M1 with the lower graphs showing, in order, the voltage across each of the MOSFETs S1-S4 of the branches B1 to B4 (labelled first to fourth protecting MOSFETs in the figure.

As can be seen from FIG. 5, initially at the time of the short circuit (shown as taking place at 1 ms), all MOSFETs S1-S4 are in a conductive state so current starts to flow through ballast resistive elements RB1 to RB4. The initial current flow slowly decays with the resistive elements RB1 to RB4 dissipating the energy from the coil R1 while keeping the voltage across MOSFET M1 below avalanche risk and without major dissipation of energy in MOSFETs S1-S4.

At the point close to 2 ms, the MOSFET S1 is caused by the timing circuit 13' to assume a non-conductive state, Consequently, current now only continues to flow through ballast resistive elements RB2 to RB4. This current again decays as the ballast resistive elements RB2 to RB4 dissipate the energy from the coil L1, again keeping the voltage across MOSFET M1 below avalanche risk (48V) and without major dissipation of energy in MOSFETs. S2-S4.

At the point about 2.8 ms, the MOSFET S2 is caused by the timing circuit 13' to assume a non-conductive state. Consequently, current now only continues to flow through ballast resistive elements RB3 and RB4 This current again decays as the ballast resistive elements RB3 and RB4 dissipate the energy from the coil L1, again keeping the voltage across MOSFET M1 below avalanche risk and without major dissipation of energy in MOSFETs. S3-S4.

At the point close to 3.6 ms, the MOSFET S3 is caused by the timing circuit 13' to assume a non-conductive state. Consequently, current now only continues to flow through ballast resistive element RB4. This current again decays as the ballast resistive element RB4 dissipates remaining energy in the coil L1, again keeping the voltage across MOSFET M1 below avalanche risk and without major dissipation of energy in MOSFET S4. At a point close to 4.2 ms it becomes safe to cause MOSFET S4 to assume a non-conductive state without risk to MOSFET M1. Even at this point, it will be noted that the voltage across the MOSFET S4 remains below 48 V which is close to the breakdown voltage.

The timing interval Δ between the control commands to control terminals $12_{B1}$, $12_{B2}$, $12_{B3}$, $12_{B4}$ does not have to be identical and depends on the resistance of the ballast resistive elements, on the current being controlled by the switching circuit, the inductance associated with the load, and the consequent energy that needs to dissipated from the inductance. The timing interval Δ will also depend on how many protection branches are selected to be incorporated into the switching circuit.

The resistive value of the ballast resistive elements of the protection branches is chosen to absorb the turn off energy of the inductance during the time when current flows there through and the predetermined time interval Δ is chosen to be as long as the current needs to settle, that is, current I=V/resistive elements. The value is also chosen to limit the voltage pulse that occurs across the coil L1. It will be noted that the resistance value of the ballast resistive element should not be greater than Vbreakdown/maximum current, where Vbreakdown is the breakdown voltage for the MOSFETs.

It will be apparent that the timing circuit can take many forms, for example, an RC circuit, a counter, or a micro controller. The detailed construction of a timing circuit introducing a delay in its output after initiation will be readily apparent to those skilled in the art.

In an improvement of the embodiment described with reference to FIG. 4, the timing circuit 13' can be designed to change the way the MOSFETS S1-S4 are switched by choosing relatively slower (smooth) switching or relatively faster (hard) switching. In this case, for each output to control terminals $12_{B1}$, $12_{B2}$, $12_{B3}$, $12_{B4}$, a capacitor C can be provided between the control terminal (gate) of the MOSFET in question and the source (which is connected via terminal T2 to coil L1). The capacitor is selected to be much larger than the intrinsic gate/source capacitance of the MOSFET. A resistance R is provided in series between the output of the timing circuit and the gate/control terminal. The voltage across the gate/source will therefore vary according to the time constant τ=R.C.

For a resistance R=100 ohms, and a capacitance of 47 nF, the value of τ is 4.7 μs. Switching at this speed is relatively fast and constitutes hard switching.

For a resistance R=3,300 ohms, and a capacitance of 47 nF, the value of τ is 155.1 μs. Switching at this speed is relatively slow and constitutes smooth switching.

If hard switching is used, then almost all the inductive energy to be dissipated by the respective protection branch is dissipated in the respective ballast resistive element with a negligible amount of the inductive energy being dissipated in the respective MOSFET of the protection branch.

If smooth switching is used, then the majority of the inductive energy to be dissipated by the respective protection branch is dissipated in the respective ballast resistive element with a non-negligible amount of the inductive energy being dissipated in the respective MOSFET of the protection branch.

It will be appreciated that what constitutes hard and smooth switching is a matter of choice with respect to the amount of energy that is to be allowed to be dissipated in the MOSFET. The balance between dissipation of energy in the ballast resistive element and the MOSFET is a matter of choice according to the technical specification of the MOSFET and the situation where the switching circuit is being used.

When a plurality of protection branches are used, it will be appreciated that the type of switching can be adapted according to need.

In one case, the switching of the secondary solid state switches can be chosen to be all smooth switching. This is particularly helpful for the high side arrangement of the switching circuit or if the protection branch comprises a series connected first ballast resistive element, a MOSFET, and a second ballast resistive element.

In another case, the switching of the secondary solid state switches can be chosen to be all hard switching. This is particularly helpful for the low side arrangement of the switching circuit.

In still another case, a hybrid of smooth and hard switching of the secondary solid state switches of the plurality of protection branches can be chosen making it possible to specifically tailor the pattern of disconnection of the protection branches. For example, hard switching can be used for the secondary solid state switches of all the plurality of protection branches apart from the protection branch that is last to receive a turn off control command, which can be smooth switched so that a non-negligible amount of the inductive energy is dissipated in the MOSFET of that protection branch. In this way, when the energy in the coil L1 is still relatively high, the protection branch can use hard switching so that virtually all energy is dissipated in the respective ballast resistive element with smooth switching being introduced when the remaining energy has decreased enough.

It will be appreciated that if hard switching is used to cause the secondary solid state switch of the last connected protection branch to assume a non-conductive state, this can result in an irregular voltage pulse. In this case, the ballast resistive element of that protection branch can be replaced by a transient voltage suppression (TVS) diode.

It will be understood that the embodiments illustrated above show applications only for the purposes of illustration. In practice, embodiments may be applied to many different configurations, the detailed embodiments being straightforward for those skilled in the art to implement. For example, although all the figures show a solid state switch in the form of a MOSFET, it will be apparent to those skilled in the art that a discrete solution switch can be used. Furthermore, the description refers to MOSFETs. However, an IGBT solid state switch can also be used. In addition, the protection branch can comprise a series connected first ballast resistive element, a MOSFET, and a second ballast resistive element.

What is claimed is:

1. A method, comprising:
   disconnecting a power line providing current to a load having inductance, the disconnecting comprising:
   connecting a primary solid state or discrete solution switch arrangement between the power line and the load, the primary solid state or discrete solution switch arrangement operable by primary turn on or turn off control commands to assume a conductive or non-conductive state;

connecting, in parallel with the primary solid state or discrete solution switch arrangement, one or more protection branches each providing a respective low RC path comprising a series connected resistive element a secondary solid state or discrete solution switch that is operable by branch turn on or turn off control commands to assume a conductive or non-conductive state, and a capacitor between a gate of the secondary solid state or discrete solution switch and the load;

applying, to the primary solid state or discrete solution switch arrangement, a primary turn on control command effective to cause the primary solid state or discrete solution switch arrangement to assume the conductive state;

applying, to the secondary solid state or discrete solution switches, a secondary turn on control command effective to cause the secondary solid state or discrete solution switches to assume the conductive state;

detecting a short circuit in the load;

applying, responsive to detecting the short circuit in the load and to the primary solid state or discrete solution switch arrangement, a primary turn off control command effective to cause the primary solid state or discrete solution switch arrangement to assume the non-conductive state; and applying, to the secondary solid state or discrete solution switch of the protection branches, a branch turn off control command that is delayed because of the respective low RC path at each of the protection branches by a predetermined time interval relative to when the primary turn off control command is applied to the primary solid state or discrete solution switch arrangement such that energy associated with the inductance dissipates through the series connected resistive elements while the secondary solid state or discrete solution switches assume the conductive state during the delay, wherein the capacitors are configured to cause the secondary solid state or discrete solution switches of the protection branches to switch at respective predetermined speeds.

2. The method of claim 1, the disconnecting further comprising:
applying, sequentially to the secondary solid state or discrete solution switches of the protection branches, the branch turn off control command.

3. The method of claim 2, the disconnecting further comprising:
applying branch turn off control commands in sequence to the secondary solid state or discrete solution switches of the protection branches,
each branch turn off control command being delayed by a different predetermined time interval relative to when the primary turn off control command is applied to the primary solid state or discrete solution switch arrangement.

4. A system, comprising;
a switching circuit for disconnecting a power line providing current to a load having inductance, the switching circuit comprising:
a first terminal for connection to the power line;
a second terminal for connection to the load;
a primary solid state or discrete solution switch arrangement connected between the first terminal and the second terminal and operable by primary turn on or turn off control commands to assume a conductive or non-conductive state;

one or more protection branches connected in parallel with the primary solid state or discrete solution switch arrangement, the protection branches each providing a respective low RC path comprising a series connected resistive element a secondary solid state or discrete solution switch that is operable by branch turn on or turn off control commands to assume a conductive or non-conductive state, and a capacitor between a gate of the secondary solid state or discrete solution switch and the load; and a timing circuit formed at least in part from each respective low RC path of the protection branches and configured to apply, to the secondary solid state or discrete solution switch of each the protection branches, a branch turn off control command that is delayed because of the respective low RC path at that protective branch by a predetermined time interval relative to when a primary turn off control command is applied to the primary solid state or discrete solution switch arrangement such that energy associated with the inductance dissipates through the series connected resistive elements while the secondary solid state or discrete solution switches assume the conductive state during the delay, wherein the capacitors are configured to cause the secondary solid state or discrete solution switches of the protection branches to switch at respective predetermined speeds.

5. The system of claim 4, wherein the one or more protection branches comprises a single protection branch.

6. The system of claim 5, wherein the predetermined speed of the single protection branch comprises a speed that allows a non-negligible amount of energy from the inductance to be dissipated.

7. The system of claim 5, wherein the predetermined speed of the single protection branch comprises a speed that allows a negligible amount of energy from the inductance to be dissipated.

8. The system of claim 4, wherein the one or more protection branches comprise a plurality of protection branches.

9. The system of claim 8, wherein the timing circuit is configured to apply branch turn off control commands in sequence to the secondary solid state or discrete solution switches of the protection branches, each of the branch turn off control commands being delayed by a different predetermined time interval relative to when the primary turn off control command is applied to the primary solid state or discrete solution switch arrangement.

10. The system of claim 9, wherein the predetermined speeds comprise a speed that allows a non-negligible amount of energy to dissipate from the inductance.

11. The system of claim 9, wherein the predetermined speeds comprise a speed that allows a negligible amount of energy to dissipate from the inductance.

12. The system of claim 8, wherein the capacitors are all similar.

13. The system of claim 8, wherein the capacitors comprise at least two different capacitors.

14. The system of claim 4, wherein the primary solid state or discrete solution switch arrangement comprises an arrangement of a plurality of solid state or discrete solution switches each connected in parallel between the first terminal and the second terminal and each operable by a common turn on or turn off control command.

15. The system of claim 4, wherein the primary solid state or discrete solution switch arrangement comprise MOSFET switches or IGBT switches.

16. The system of claim 4, wherein the primary turn off control command or the branch turn off control command is an absence of a primary turn on control command or a branch turn on control command.

17. The system of claim 4, wherein the timing circuit is connected to receive same primary turn on or turn off control commands as the primary solid state or discrete solution switch arrangement.

18. The system of claim 4, wherein each respective low RC path of the protection branches that forms the timing circuit comprises at least part of an RC circuit having a predetermined time constant based on the resistive element to cause delay for at least some of the predetermined time interval relative to when the primary turn off control command is applied.

19. The system of claim 4, wherein the resistance of each resistive element of the protection branches and the predetermined time interval of the timing circuit are selected to inductively absorb energy to protect the primary solid state or discrete solution switch arrangement after the primary turn off control command is applied to the primary solid state or discrete solution switch arrangement.

20. A system, comprising means for disconnecting a power line providing current to a load having inductance, the means for disconnecting comprising:
   means for connecting a primary solid state or discrete solution switch arrangement between the power line and the load, the primary solid state or discrete solution switch arrangement operable by primary turn on or turn off control commands to assume a conductive or nonconductive state;
   means for connecting, in parallel with the primary solid state or discrete solution switch arrangement, one or more protection branches each providing a respective low RC path comprising a series connected resistive element a secondary solid state or discrete solution switch that is operable by branch turn on or turn off control commands to assume a conductive or nonconductive state, and a capacitor between a gate of the secondary solid state or discrete solution switch and the load;
   means for applying, to the primary solid state or discrete solution switch arrangement, a primary turn off control command; and
   means for applying, to the secondary solid state or discrete solution switch of the protection branches, a branch turn off control command that is delayed because of the respective low RC path at each of the protection branches by a predetermined time interval relative to when the primary turn off control command is applied to the primary solid state or discrete solution switch arrangement such that energy associated with the inductance dissipates through the series connected resistive elements while the secondary solid state or discrete solution switches assume the conductive state during the delay,
   wherein the capacitors are configured to cause the secondary solid state or discrete solution switches of the protection branches to switch at respective predetermined speeds.

* * * * *